(12) United States Patent
Martelock et al.

(10) Patent No.: US 12,184,309 B2
(45) Date of Patent: Dec. 31, 2024

(54) DYNAMIC CONTENT ENCODING

(71) Applicant: Apple Inc., Cupertino, CA (US)

(72) Inventors: Christian T. Martelock, Los Gatos, CA (US); Ali Sazegari, Los Altos, CA (US); Eric Bainville, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 204 days.

(21) Appl. No.: 18/077,196

(22) Filed: Dec. 7, 2022

(65) Prior Publication Data

US 2023/0344445 A1 Oct. 26, 2023

Related U.S. Application Data

(60) Provisional application No. 63/335,213, filed on Apr. 26, 2022.

(51) Int. Cl.
*H03M 7/30* (2006.01)
*G06F 40/211* (2020.01)
*H03M 7/42* (2006.01)

(52) U.S. Cl.
CPC ............. *H03M 7/30* (2013.01); *G06F 40/211* (2020.01); *H03M 7/3071* (2013.01); *H03M 7/3079* (2013.01); *H03M 7/42* (2013.01)

(58) Field of Classification Search
CPC ........ H03M 7/30; H03M 7/3071; H03M 7/42; H03M 7/3079; G06F 40/211
USPC ...................................... 341/50–51
See application file for complete search history.

(56) References Cited

U.S. PATENT DOCUMENTS

| 8,473,428 B2 * | 6/2013 | Li .................. H04L 12/6418 706/12 |
| 2002/0118885 A1 * | 8/2002 | Smeets ................ H03M 7/30 382/246 |

* cited by examiner

*Primary Examiner* — Khai M Nguyen
(74) *Attorney, Agent, or Firm* — BAKERHOSTETLER

(57) ABSTRACT

A method for encoding text includes grouping text as a sequence of bytes, the text comprising a string of characters, each byte corresponding to a character in the text. For each byte of the sequence of bytes: (a) each bit is processed from most significant bit to least significant bit to generate a context; and (b) a subsequent bit is predicted, using a prediction model, based on the context generated based on previously processed bits, prediction of the prediction model being a combination of predictions of a plurality of sub-models. An encoded bitstream is output based on the predicted bits. The encoded bitstream includes encoded data corresponding to the text.

20 Claims, 7 Drawing Sheets

DYNAMIC CONTENT ENCODING

CROSS REFERENCE TO RELATED APPLICATIONS

This application claims the benefit of priority to U.S. Provisional Patent Application No. 63/335,213, entitled, "Dynamic Content Encoding", filed on Apr. 26, 2022, the disclosure of which is hereby incorporated herein in its entirety.

TECHNICAL FIELD

The present description relates generally to data compression, and in particular to a lossless data compression for dynamic content.

BACKGROUND

Lossless data compression is used in many places in operating systems, for software and asset distribution, for content encodings (embedded in communication protocols), and the like. In the case of content encodings, it is possible to distinguish between static and dynamic content. Usually, dynamic content is only encoded, transmitted and decoded once. However, existing compression schemes may provide poor compression for very short text messages.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

Figure 1:
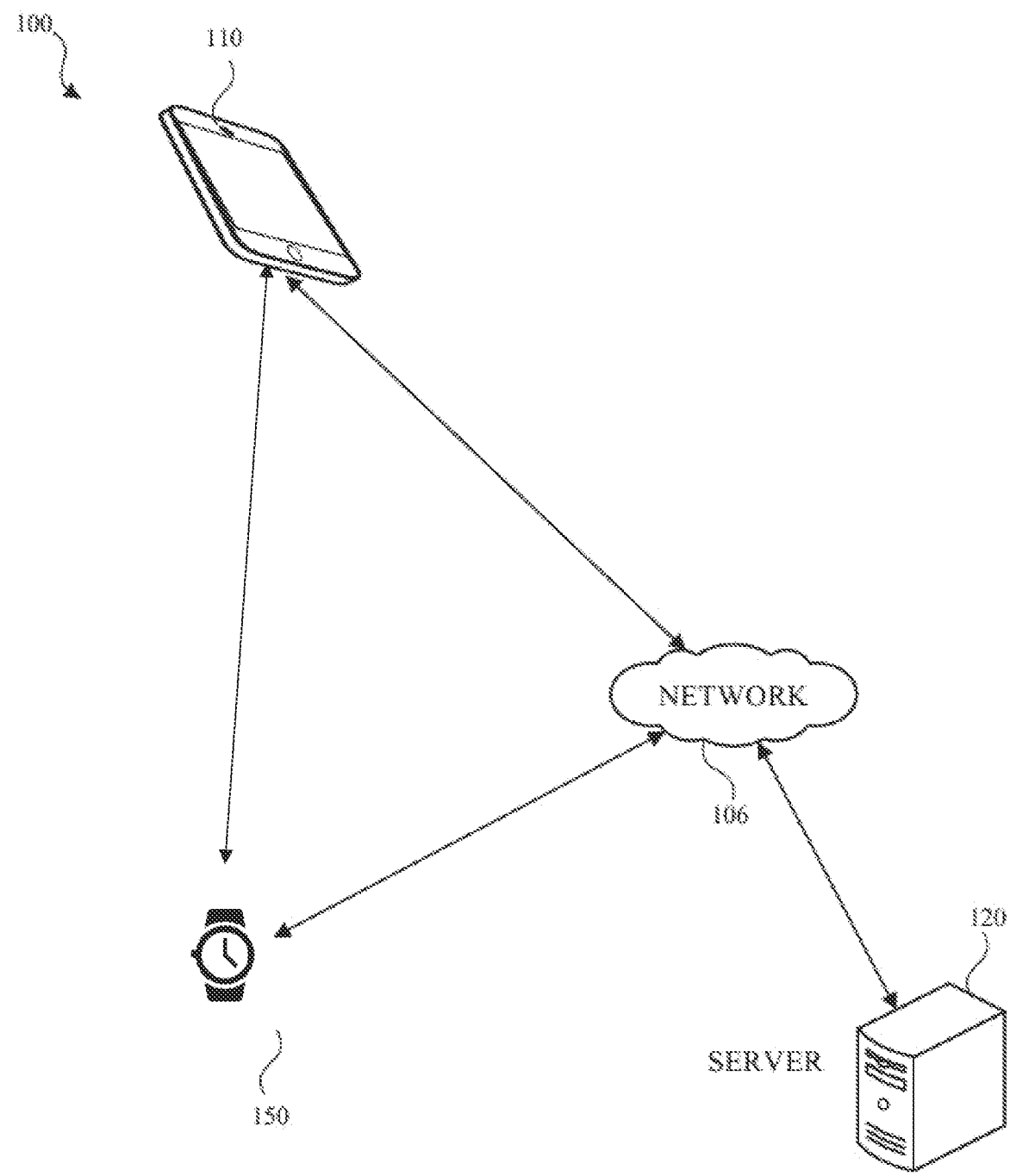
FIG. 1 illustrates an example of an environment in which state information between devices is exchanged in accordance with one or more implementations.

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, the subject technology is not limited to the specific details set forth herein and can be practiced using one or more other implementations. In one or more implementations, structures and components are shown in block diagram form in order to avoid obscuring the concepts of the subject technology.

Dynamic content changes frequently, and thus, transmission of dynamic content may require thousands of instances of encoding/decoding at the same time. However, in certain instances the bandwidth for transmitting dynamic content in a client/server exchange may be severely restricted.

For example, in the context of very short text messages that may be sent, for example, from a wearable device to another device that may include and/or may be a server, the server may receive thousands of messages at the same time. In such a context, it may be important to transmit each message to the server and have the server process each message in turn, while the time needed for encoding/decoding such short text messages may not be important. Moreover, in such contexts, the amount of data in each message may be short and there may not be any repetition within the message, making it difficult for conventional encoding methods to provide high compression. Consequently, memory consumption during encoding/decoding of dynamic content becomes an important parameter while time taken for encoding/decoding may not be as important.

The present disclosure is the result of the realization that compression in the context of dynamic content and very short messages (e.g., less than 200 characters) may be difficult to achieve in a bandwidth constrained environment. The systems, methods and processes described herein provide for lossless compression of very short messages. Using the systems, methods and processes described herein, encoding can be performed simultaneously thousands of times without necessarily increasing memory requirements.

The subject systems, methods and processes utilize one or more n-gram models that can predict a subsequent bit using n previously processed bits as context. Each of the n-gram models may generate a probability of the subsequent bit being a one using a hash look-up table based on the values of n previously processed bits. The hash look-up table can be generated by training the n-gram model using a predefined data set. In other words, in one or more implementations the n-gram models are static and need not be retrained, and are shared by thousands of instances. Consequently the systems, methods and processes need a small amount of memory to encode a data stream—essentially the amount of memory utilized to store the hash look-up tables for the various n-gram models being used.

In this manner, the subject systems, methods and processes can provide lossless compression of very short amount of data using a static prediction model that requires a small amount of memory and that can provide high compression ratio by compressing the data bit-by-bit instead of byte-by-byte.

The subject systems, methods and processes encode the text to be compressed by grouping the text as a sequence of bytes. The text may include a string of characters including, example, a space, a punctuation mark, a letter, a number, a special character available on a keyboard, and the like. Each byte in the sequence of bytes corresponds to a character in the text. In other encodings (like UTF-8), a single character might be represented by a sequence of bytes. For each byte, each bit, taken from the most significant to the least significant bit, is processed to generate a context. Then, using a prediction model, a subsequent bit is predicted based on the context generated using the previously processed bits. The prediction of the prediction model is a combination of prediction of a plurality of sub-models. The encoded bitstream is then output based on the predicted bits. The encoded bitstream includes encoded data corresponding to the text that is already processed.

FIG. 1 illustrates an example of an environment in which state information between devices is exchanged in accordance with one or more implementations. Not all of the depicted components may be used in all implementations, however, and one or more implementations may include additional or different components than those shown in the figure. Variations in the arrangement and type of the components may be made without departing from the spirit or scope of the claims as set forth herein. Additional components, different components, or fewer components may be provided.

The network environment 100 includes an electronic device 110, a server 120, and an electronic device 150. The network 106 may communicatively (directly or indirectly) couple the electronic device 110 and/or the server 120, the electronic device 150 and/or the server 120, the electronic device 110 and/or the electronic device 150. In one or more implementations, the network 106 may be an interconnected network of devices that may include, or may be communicatively coupled to, the Internet. For explanatory purposes, the network environment 100 is illustrated in FIG. 1 as including an electronic device 110, an electronic device 150, an and a server 120; however, the network environment 100 may include any number of electronic devices and any number of servers.

The electronic device 110 may be, for example, desktop computer, a portable computing device (e.g., a laptop computer, a smartphone, etc.), a peripheral device (e.g., a digital camera, headphones), a tablet device, a wearable device (e.g., a watch, a band, etc.), a computing device (e.g., an embedded computing device), and the like, or any other appropriate device.

In some implementations, the electronic device 110 includes, for example, one or more wireless interfaces, such as WLAN radios, cellular radios, Bluetooth radios, Zigbee radios, near field communication (NFC) radios, and/or other wireless radios.

Figure 6:
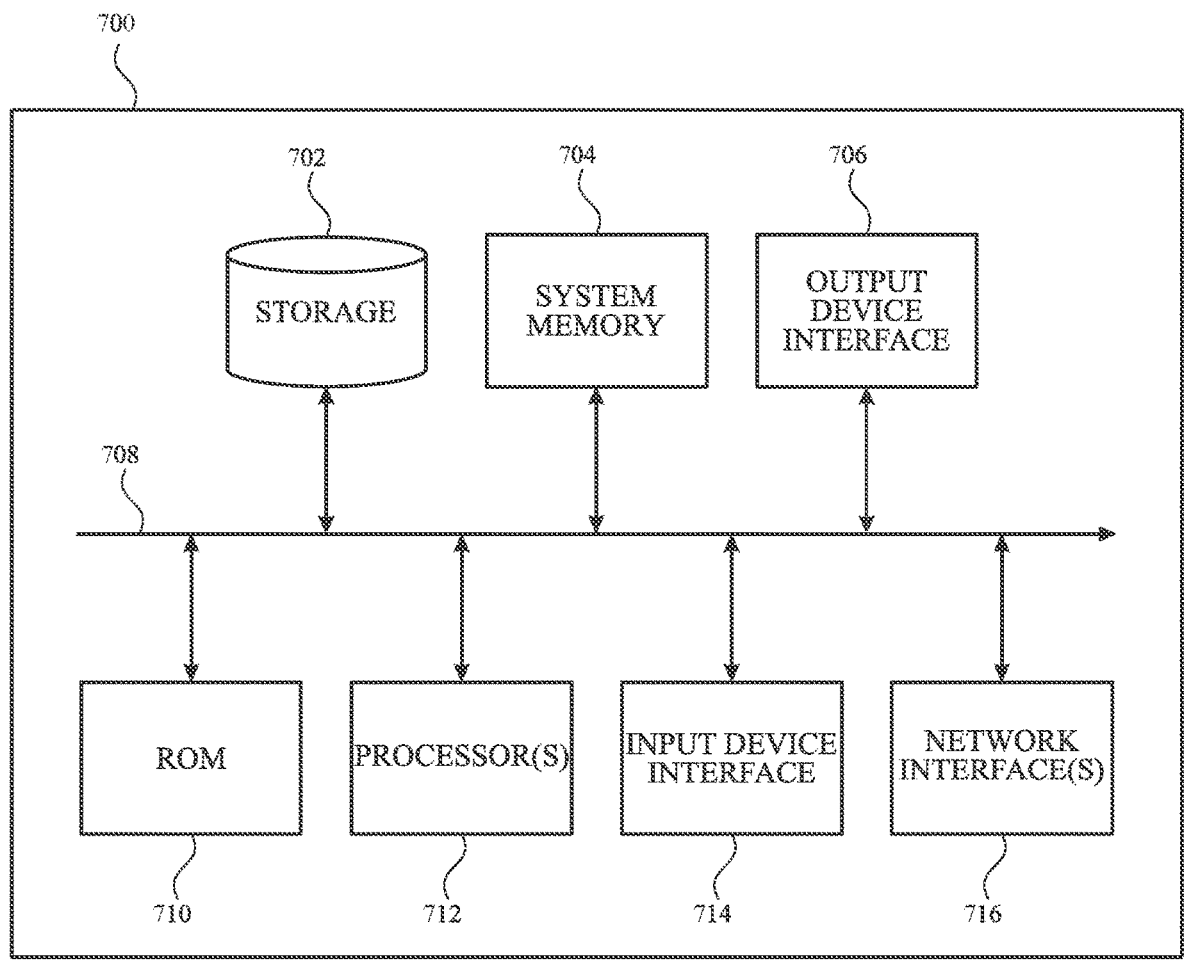
FIG. 6 illustrates an electronic system with which one or more implementations of the subject technology may be implemented.

The electronic device 110 may be, and/or may include all or part of, the electronic system discussed herein with respect to FIG. 6. In one or more implementations, the electronic device 110 may include a touchscreen, a camera, a microphone and/or other components. In some implementations, the electronic device 110 may be, for example, a portable computing device (e.g., a laptop computer) that includes a touchscreen, a smartphone that includes a touchscreen, a peripheral device that includes a touchscreen (e.g., a digital camera, headphones), a tablet device that includes a touchscreen, a wearable device that includes a touchscreen (e.g., a watch, a band, etc.), a computing device (e.g., an embedded computing device) that includes a touchscreen, and the like, any other appropriate device that includes, for example, a touchscreen, or any electronic device with a touchpad. The electronic device 110, may further include motion sensors such as gyroscopes, accelerometers, global positioning system (GPS) components, magnetic sensors such as compasses, and the like, and may be, for example, a smart phone or media player device. Additionally, the electronic device 110 includes a memory on which data can be stored. In FIG. 1, by way of example, the electronic device 110 is depicted as a smartphone.

In one or more implementations, the electronic device 150 may be, for example, a desktop computer, a portable computing device (e.g., a laptop computer, a smartphone, etc.), a peripheral device (e.g., a digital camera, headphones, etc.), a tablet device, a wearable device (e.g., a watch, a band, etc.), a computing device (e.g., an embedded computing device), and the like, or any other appropriate device.

In one or more implementations, the electronic device 150 may include a touchpad, one or more buttons, a camera, a microphone, one or more speakers, and/or other components. In some implementations, the electronic device 150 may be, for example, a peripheral device that includes a touchpad, a microphone and one or more speakers, (e.g., one or a pair of earphones or earbuds), a wearable device that includes a touchscreen, microphone and one or more speakers (e.g., a watch, a band, etc.), or any other appropriate device that includes, for example, one or more output devices. The electronic device 150, may further include one or more sensors (e.g., compasses, pressure sensors, touch sensors, and the like), and a processor for processing data (e.g., audio, video, audiovisual, and the like) (e.g., generated data, received data, stored data, data to be transmitted, etc.). Additionally, the electronic device 150 includes a memory on which data can be stored. In FIG. 1, by way of example, the electronic device 150 is depicted as a smartwatch. However, the electronic device 150 can be any suitable type of electronic device.

In one or more implementations, the electronic device 150 may be configured to enable a user to send short messages (e.g., pre-programmed or user defined messages) to a server, for example, in an emergency or for notifying a location (or a change in location), a status (or a change in status), and the like, to the server 120 and/or the electronic device 110. In some implementations, the messages may be, e.g., less than 200 characters long. In some implementations, the electronic device 150 may automatically send short messages to the server 120 and/or the electronic device 110 without user intervention. The short messages may be in the form of a text or a string of characters in any language. In some implementations, the string of characters may be a transliteration of words from a language into English or any other language.

In one or more implementations, the electronic device 150 may be, and/or may include all or part of the electronic system discussed below with respect to FIG. 6. The electronic device 110 may also provide data in the form of media (e.g., audio, video, audiovisual, and the like) to electronic device 150 and/or the server 120 (e.g., directly over a wired or wireless peer-to-peer connection or over the network 106 with the electronic device 110, and/or the server 120).

In one or more implementations, the server 120 provides a remote data storage for storing data associated with or generated by the electronic device 110 and/or the electronic device 150. It should be appreciated that the electronic device 110, the electronic device 150 and/or server 120 can access and exchange data stored on other devices and/or servers directly (e.g., without network 106) using wireless signals such as near-field communications (NFC), Bluetooth signals, direct WiFi signals, and/or wired connections.

By way of example, FIG. 1 shows a network environment 100 in which a user interacts directly with the electronic device 110 and/or the electronic device 150 using input devices such as a touchscreen thereof to access and/or manipulate data stored on the electronic device 110, electronic device 150 and/or the server 120 through an application such as text editor on the electronic device 110. In such an environment, the electronic device 110 is the primary device while the server 120 and/or the electronic device 150 are the secondary device.

Figure 2:
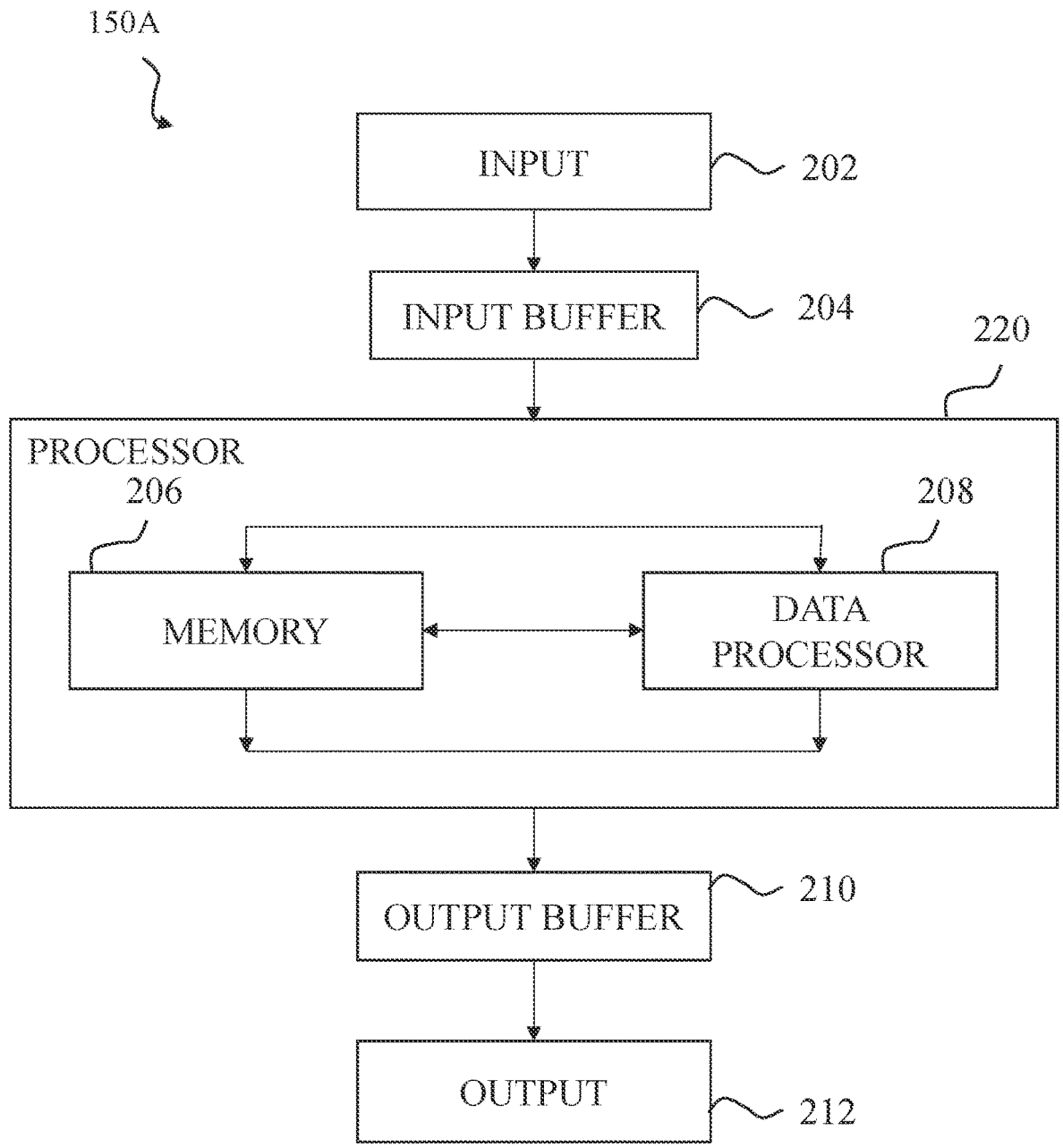
FIG. 2 illustrates data flow in a device used for processing data in accordance with one or more implementations.

FIG. 2 illustrates data flow in a device used for processing data in accordance with one or more implementations. Typical processing of data (e.g., at the server 120) begins when the data is received at an input 202. The data is then transferred to a processor 220, where it is processed, and output to the output 212.

While FIG. 1 shows the electronic device 150 to be a smartwatch as an example, the electronic device 150 can be any suitable device. Examples can include input devices (e.g., stylus, mouse, trackpad, keyboard, camera, microphone etc.), output devices (e.g., speaker, display, haptic output device, home pod, etc.), peripheral device, home automation device (e.g., thermostat, doorbell, light switch), smart appliance (e.g., fridge, etc.) sensor device (e.g., fingerprint sensor, biometric sensor, robot sensor, vehicle sensor, appliance sensor, etc.), computing device (e.g., phones, laptop, FPGA, embedded computing device, etc.), electronic key, wearable device, health tracking device, accessory device.

The electronic device 150 may include, for example, one or more wireless interfaces, such as WLAN radios, cellular radios, Bluetooth radios, Zigbee radios, near field communication (NFC) radios, and/or other wireless radios. The device may be, and/or may include all or part of, the electronic system discussed herein with respect to FIG. 6. In one or more implementations, the device may include one or more input devices such as, for example, a touch activated input region or a button. In one or more implementations, the device may pair with other devices such as a desktop computer, a laptop or a portable computer, a mobile electronic device, or a wearable device.

The processor 220 may include a memory 206 and a data processor 208. Depending on specific implementations, the processor 220 may also include other processors such as, for example, a graphics processor (which is not explicitly shown in FIG. 2). Thus, based on the type of device, the data processor 208 may perform, among other things, compression and/or decompression of the received data, encrypt the received data for storage, modulate or demodulate the received data, and/or perform other data manipulation.

In some implementations such as a smartwatch, the processor 220 may receive the short message that is either generated at the smartwatch a (e.g., pre-programmed or user defined messages) to be transmitted to the server (or another electronic device), for example, in an emergency or for notifying a location (or a change in location), a status (or a change in status), and the like. In some implementations, the short message may be additionally sent to another device such as, for example, a smartphone, a laptop computer, a desktop computer, or other electronic device that is paired to the smartwatch.

In some implementations, because of the environment in which the electronic devices functions, the processor 220 may have limited processing resources. Processing resources can include a processing unit (e.g., CPU), FPGA, ASIC, hardware electronic circuit, etc. For example, in some implementations, thousands of instances of data processing (e.g., a data compression and/or a data decompression) may need to be performed at the same time within given memory constraints. In some implementations, the processing resources of the processor 220 include a memory 206 which may be used as a cache or to provide a data buffer for certain data processing algorithms.

For example, in some implementations, while processing the received data, the data processor 208 may store some or all of received data, processed data and/or intermediate data in memory 206. The memory 206 may include RAM, ROM, and/or non-volatile memory.

Upon or during the processing the data, the data processor 208 may write the processed data to the memory 206 and/or to an output buffer 210.

Figure 3:
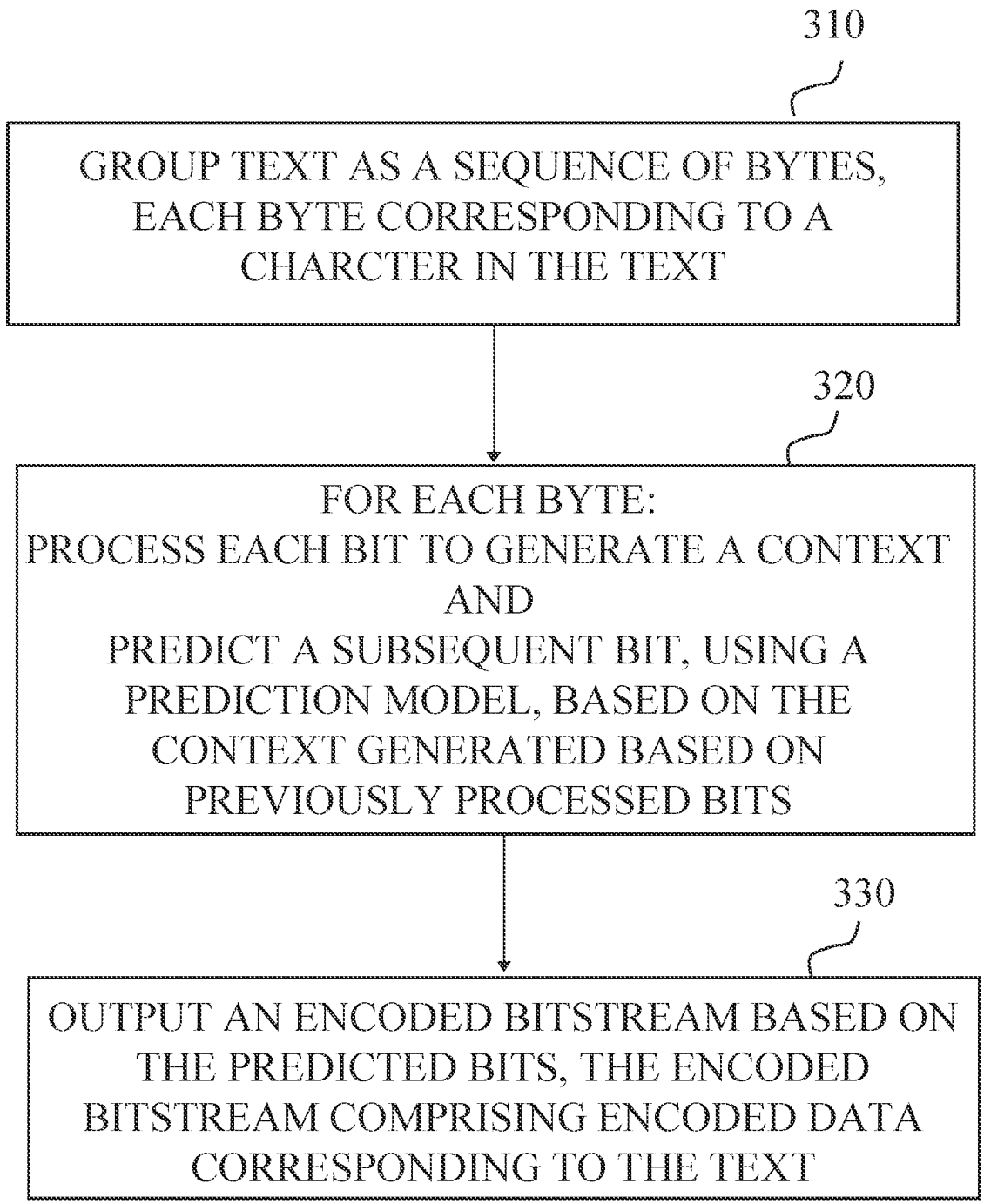
FIG. 3 illustrates a flow diagram of an example process for coding an input stream in accordance with one or more implementations.

FIG. 3 illustrates a flow diagram of an example process for encoding a sequence of characters in accordance with one or more implementations. At 310, text (e.g., received at a server, input by a user or automatically generated by an application) is grouped as a sequence of bytes. The text may include a sequence of characters. Consequently, each byte corresponds to a character in the sequence of characters. The characters may include, but are not limited to, a space, a punctuation mark, a letter, a number, a special character available on a keyboard, and the like.

The text may be related to a message generated based on a user input or generated automatically by an application. For example, the text may be an SOS message in case of an emergency. The content of the message may depend on the type of emergency. For example, in some implementations, the message may include a type of emergency (e.g., as an abbreviation), a location and the identity of the user or owner of the device at which the message is generated. In some instances, a server may receive thousands of such messages generated by various devices across a network at the same time. Such messages may also need to be processed at the same time. However, the server may have limited memory capacity to encode all such messages at the same time.

Consequently, in some implementations, because the methods described herein require a small amount of memory for every instantiation, a server may utilize the methods and processes described herein to encode and process such messages at the same time within memory constraints of the server.

Referring back to FIG. 3, the text being grouped may include any number or characters such as, for example, 5, 10, 15, 20, 25, 30, 35, 40, 45, 50, 55, 60, 65, 70, 75, 80. 85, 90, 95, 100, 110, 120, 130, 140, 150, 175, 200, 250, 300, 400, 500, 600, 700, 800, 900, 1000, or even more characters. Thus, the grouping of the text may correspondingly include the same number of bytes as the number of characters in the text. It will be appreciated that while the subject methods and processes are described as being useful for short or even very short messages, the subject methods and processes may be utilized for encoding text of any length (i.e., any number of characters).

At 320, each byte is processed so as to encode the text. In one or more implementations, the text may be encoded with ASCII. Thus, each bit of the byte is processed using binary decomposition from the most significant bit to the least significant bit to generate a context. Using a prediction model, based on the context generated from previously processed bits, a subsequent bit is predicted.

In one or more implementations, the prediction model may predict the subsequent bit based on a combinations of probabilities of the subsequent bit being 1. Thus, the prediction model may combine probabilities of the subsequent bit being 1 generated by one or more sub-models. Each of the one or more sub-models may use a different number of previously processed bytes/bits as a context. For example, the sub-models may use 1, 2, 3, 4, 5, 6 or more previously processed bytes and the already processed bits from the current byte to generate a probability of the subsequent bit being 1. Such models are known in the art as n-gram models. Thus, a 1-gram model uses one previously processed bit to generate a probability of the subsequent bit being 1. Similarly, a 2-gram models uses two previously processed bytes and the processed bits of the current byte, and so on.

In one or more implementations, each of the n-gram models generates the probability of the subsequent bit being 1 using a hash table lookup. The hash table may list the probability of the subsequent bit being 1 for each combination of n-number of previously processed bits. Thus, in some implementations, the hash table is addressed by using a concatenation of a sub-character context (the already processed bits) and the a sub-model context (1,2,3, . . . previously processed bytes) for the subsequent bit being 1.

In one or more implementations, at least one of the sub-models may utilize a previously processed string of characters (e.g., a word) in the text to generate a probability of the subsequent bit being 1. Such a sub-model may be referred to as a word-model. A word model may be trained to predict a subsequent character based on a previously processed word and generate a probability that the subsequent bit is 1 based on the predict subsequent character.

In some implementations, the word model may be designed to work with almost any language. In implementations where the text is encoded with ASCII or UTF-8, the word model may separate words, if it observes an input byte <=32. Thus, only ASCII control codes and space may be treated as a separator. Within a word, the word model's context is extended with each fully processed byte. In such implementations, after a separator, the word model behaves like a 0-gram model and provides a good baseline prediction.

In some implementations, the sub-models are trained using a known data set. For example, the sub-models may be trained using a known passage of text (e.g., a book or a selected passage of conversation) in a given language. It will be understood that while the sub-models are trained to generate a probability of the subsequent bit being 1, using a corresponding number of previously processed characters, the sub-models can also be trained to predict a probability of the subsequent bit being 0.

Figure 4A:
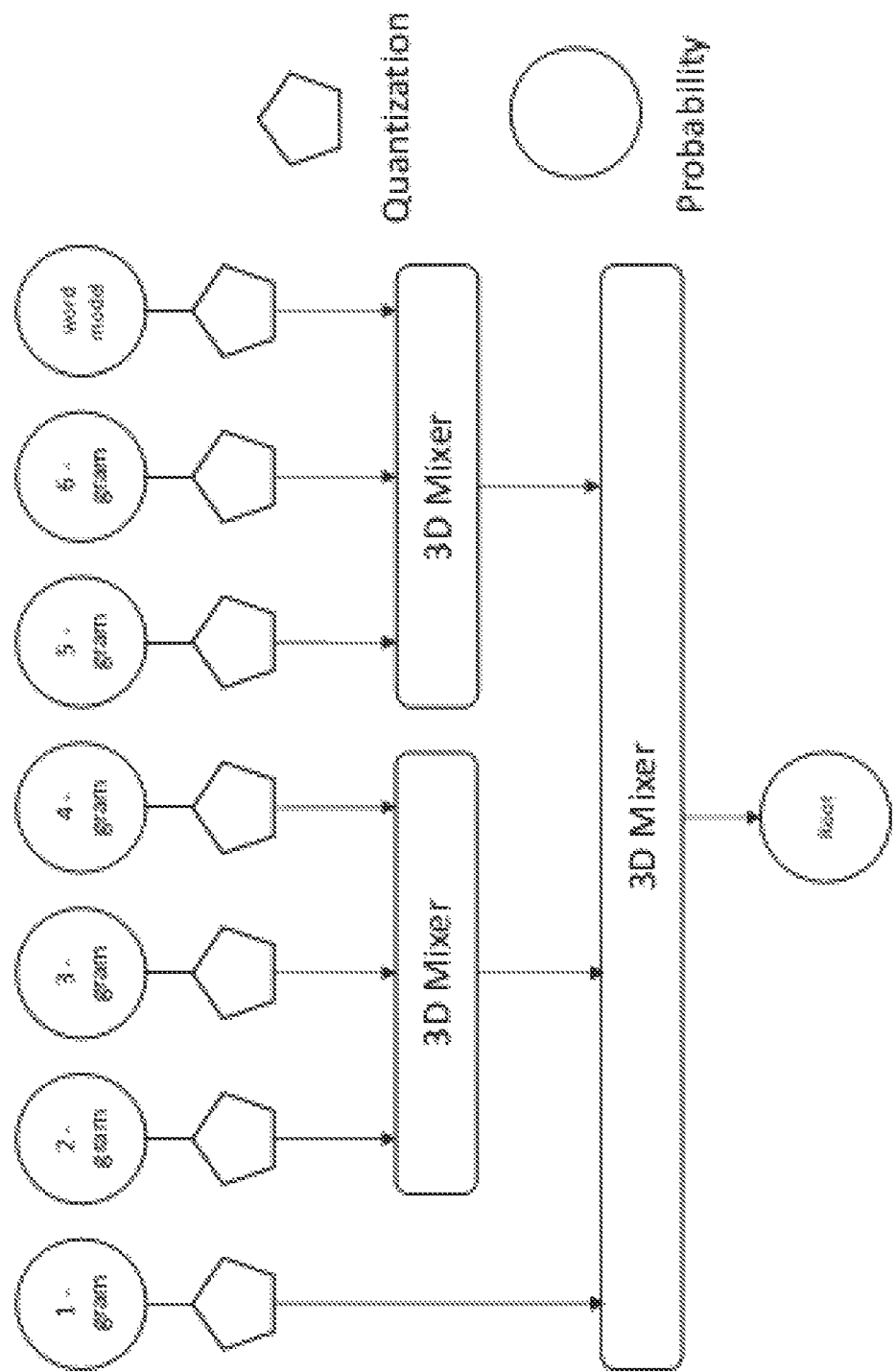
FIG. 4A is a schematic of the method of predicting the subsequent bit based on previously processed bits in accordance with one or more implementations.

In one or more implementations, the prediction model may combine the probabilities generated by the one or more sub-models using a three-dimensional function. FIG. 4A illustrates an example of a prediction model that combines a plurality of sub-models using a three-dimensional mapping. In the example of FIG. 4A, the prediction model utilizes 6 n-gram models (i.e., 1-gram, 2-gram, 3-gram, 4-gram, 5-gram and 6-gram), and a word model.

Specifically, the prediction model shown in FIG. 4A combines different order predictions using a three-dimensional function. Each order prediction may be obtained by combining a corresponding subset of sub-models among the 7 models being used. Thus, for example, a low order prediction may include a prediction from the 1-gram model. A middle order prediction may include a combination of 2-gram, 3-gram and 4-gram models and a higher order prediction may include a combination of 5-gram, 6-gram and the word models. Each order prediction may be generated by combining the corresponding subset of sub-models using, for example, a 3-D mixer. In one or more implementations, the memory efficiency (and accuracy) of the mixing can be improved by non-linearly quantizing input probabilities (e.g., providing higher precision near 0 or 1 probability values for the individual sub-models). The result of the 3-D mixing of the middle and higher order sub-models may be further quantized before using another 3-D mixer to combine the lower order sub-model with the result of the middle and higher order sub-models.

The result of the combination of the different orders of sub-models is a prediction (probability that the subsequent bit is 1), which can be utilized to process a current bit using an arithmetic coder. The coder may be simplified as the prediction of the subsequent bit improves in accuracy.

Figure 4B:
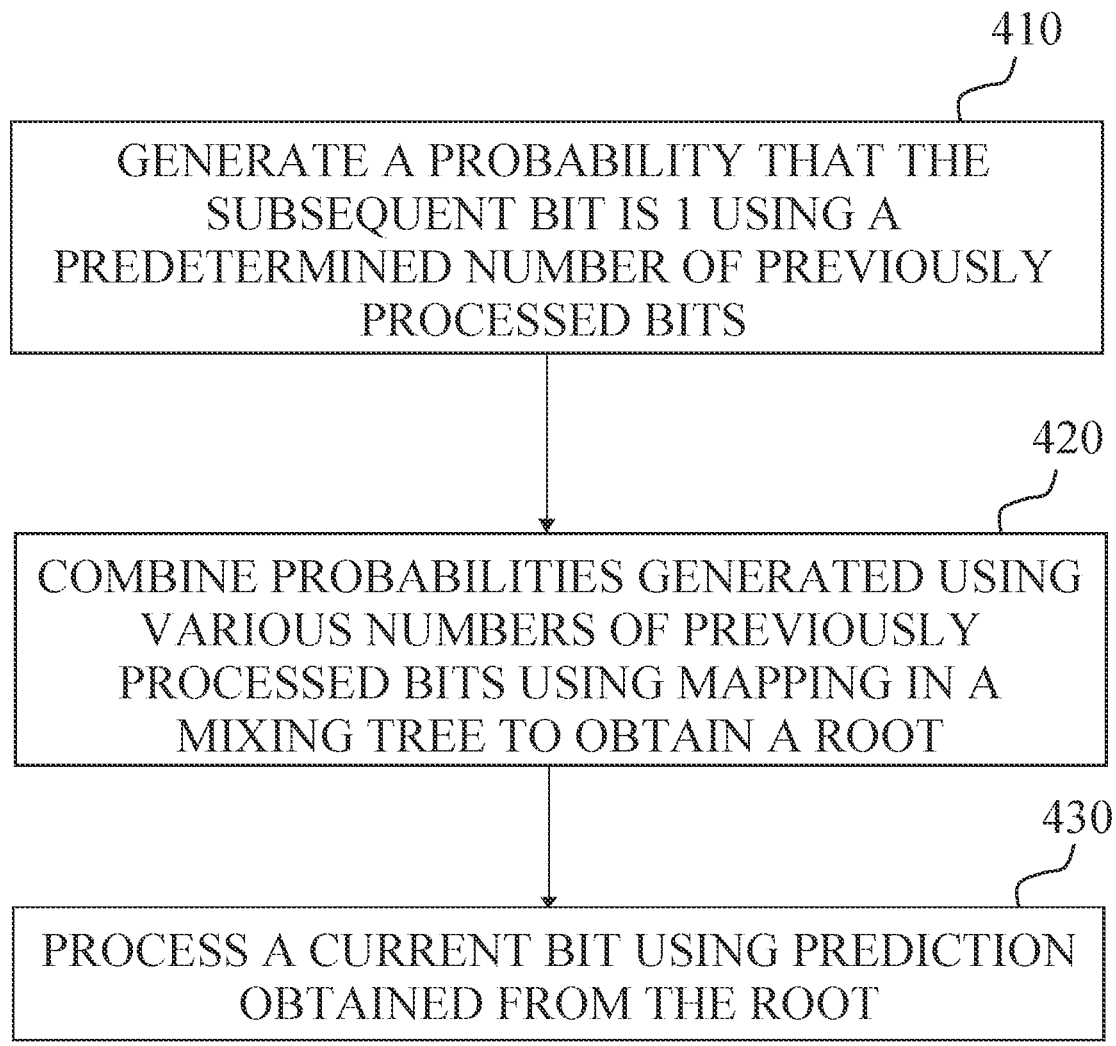
FIG. 4B illustrates a flow diagram for an example process of encoding a string of characters in accordance with one or more implementations.

FIG. 4B illustrates a flow chart for processing a current bit using a 3-D mixing of predictions from a plurality of sub-models in accordance with one or more implementations of the present disclosure. At 410, a probability that the subsequent bit is 1 is generated using a predetermined number of previously processed bits/bytes. For example, as has been discussed with respect to FIG. 4A, the predetermined number of bytes may be 1, 2, 3, 4, 5 or 6 (corresponding to the 6 n-gram models). In addition, a sub-model using a previously processed string of characters (e.g., a word) in the text may be used to generate a probability that the subsequent bit is 1.

At 420, the probabilities generated using various numbers of previously processed bits/bytes (as well as a probability generated using a string of characters) are combined using a mapping in a mixing tree to obtain a root. The mapping may be performed in 3-D in some implementations. In one or more implementations, the probability generated by each of the sub-models may be quantized before being combined using a 3-D mixer.

3-D mixers are context mixing algorithms in which predictions (that a subsequent bit is 1) are combined using a weighted summation over all models. In some implementations, 3-D mixers are trained using a known dataset and the weights may be adjusted along a gradient in a 3-D weight space to favor the models that accurately predicted the subsequent bit.

In one or more implementations, the combination of the models is performed using the scheme described by equation (1) below:

$$S_0=\varepsilon+w_i n_{0i}=\text{evidence for 0} \quad (1)$$

$$S_1=\varepsilon+\Sigma_i w_i n_{1i}=\text{evidence for 1}$$

$$S=S_0+S_1=\text{total evidence}$$

$$p_0=S_0/S=\text{probability that next bit is 0}$$

$$p_1=S_1/S=\text{probability that next bit is 1}$$

where $w_i \geq 0$ is the weight of the i'th model, $n_{0i}$ and $n_{1i}$ are the outputs $n_0$ and $n_1$ by the i-th model, and $\varepsilon>0$ is a small constant to guarantee that $S_0$, $S_1>0$ and $0<p_0$, $p_1<1$.

In one or more implementations, after coding each bit, the weights may be adjusted along the cost gradient in weight space to favor the models that accurately predicted that bit. In some implementations, the weights can either be initialized to favor a-priori known better models, or simply be set to 0 to allow rapid initial training. The predictions from equation (1) may then be arithmetic coded. In some implementations the arithmetic code of a string x is the length of x together with a number in the half-open interval $[p_{<x}, p_{<x}+p(x))$, where $p_{<x}$ is the probability that a string picked at random is lexicographically less than x. Those of ordinary skill will appreciate that other arithmetic coding schemes are contemplated within the scope of the present disclosure.

It will be appreciated that each of the sub-models (i.e., the 6 n-gram models and the word model) are static models that do not need to be updated once the models are trained using a known dataset. Similarly, the 3-D mixers may be trained by processing a known dataset to adjust the weights used in the mixing function(s) used for combining the various sub-models. The known dataset may be specific to a certain language and/or a certain context.

It will be further appreciated that some of the higher order sub-models (e.g., a word model or a 6-gram model) may fail because of unknown or unusual character strings (such as, for example, unusual abbreviations, text transliterated from a different language, relatively uncommon proper nouns, and the like). The 2-layer mixing (i.e., combining different order sub-models first, and the combing the result of the combination of the sub-models) scheme may avoid and/or mitigate such failure of higher order sub-models by providing a prediction based on lower order sub-models based on known instances of character strings that have a tendency to be together (e.g., a 'u' following a 'q'; a relatively high probability of an 'h' following a 'c' or an 's'; a relatively high probability of an 's' following an 'e' if the 'e' follows a certain set of characters, e.g., based on plural rules in English language; and the like).

At 430, the current bit is processed using the prediction obtained from the root.

Referring back to FIG. 3, the process for encoding a sequence of characters in accordance with one or more implementations ends, at 330, by outputting an encoded bitstream based on the predicted bits. The encoded bitstream includes encoded data corresponding to the text being compressed.

Figure 5:
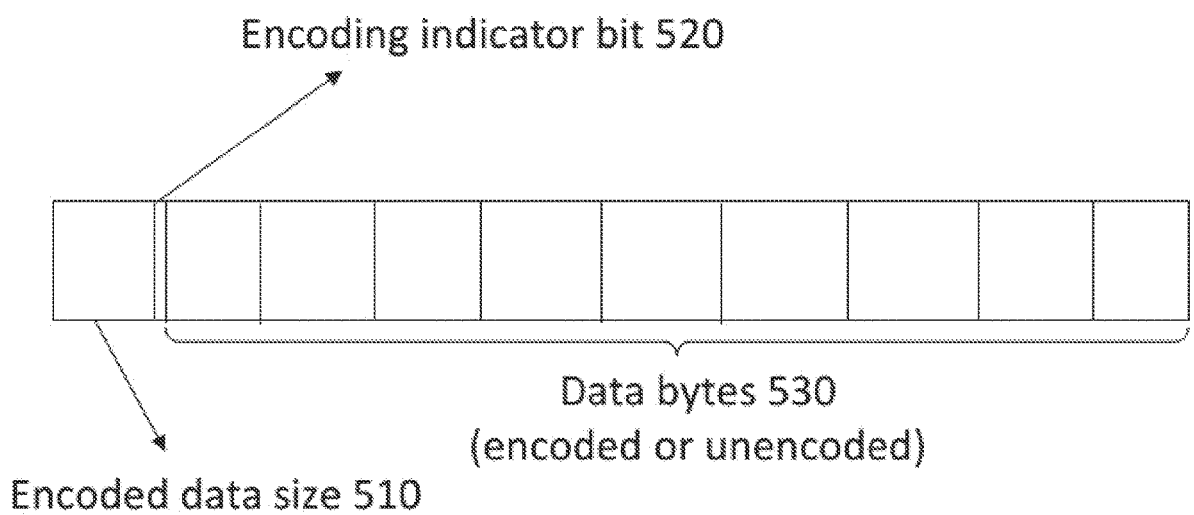
FIG. 5 illustrates a bitstream encoded using an example process in accordance with one or more implementations.

FIG. 5 illustrates an example of an encoded bitstream resulting from the process of encoding described herein. In one or more implementations, the encoded bitstream may include a first component 510 indicating a data size that is being encoded. The data size may be provided as number of bytes in some implementations. In some implementations, the first component 510 may be an encoded value of the data size is bytes using a suitable encoding scheme such as, for example, using Fibonacci encoding.

Next, the encoded bitstream includes an indicator bit 520 indicating whether the subsequent portion of the bitstream is encoded. For example, the indicator bit 520 being 1 indicates that the subsequent portion of the bitstream is encoded using an encoding process described herein, and the indicator bit 520 being 0 indicates that the subsequent portion of the bitstream is unencoded text (i.e., without compression).

FIG. 6 illustrates an electronic system 700 with which one or more implementations of the subject technology may be implemented. The electronic system 700 can be, and/or can be a part of, the electronic device 110, and/or the electronic device 130 and/or the server 120, shown in FIG. 1. The electronic system 700 may include various types of computer readable media and interfaces for various other types of computer readable media. The electronic system 700 includes a bus 708, one or more processing unit(s) 712, a system memory 704 (and/or buffer), a ROM 710, a permanent storage device 702, an input device interface 714, an output device interface 706, and one or more network interfaces 1016, or subsets and variations thereof.

The bus 708 collectively represents all system, peripheral, and chipset buses that communicatively connect the numerous internal devices of the electronic system 700. In one or more implementations, the bus 708 communicatively connects the one or more processing unit(s) 712 with the ROM 710, the system memory 704, and the permanent storage device 702. From these various memory units, the one or more processing unit(s) 712 retrieves instructions to execute and data to process in order to execute the processes of the subject disclosure. The one or more processing unit(s) 712 can be a single processor or a multi-core processor in different implementations.

The ROM 710 stores static data and instructions that are needed by the one or more processing unit(s) 712 and other modules of the electronic system 700. The permanent storage device 702, on the other hand, may be a read-and-write memory device. The permanent storage device 702 may be a non-volatile memory unit that stores instructions and data even when the electronic system 700 is off. In one or more implementations, a mass-storage device (such as a magnetic or optical disk and its corresponding disk drive) may be used as the permanent storage device 702.

In one or more implementations, a removable storage device (such as a floppy disk, flash drive, and its corresponding disk drive) may be used as the permanent storage device 702. Like the permanent storage device 702, the system memory 704 may be a read-and-write memory device. However, unlike the permanent storage device 702, the system memory 704 may be a volatile read-and-write memory, such as random access memory. The system memory 704 may store any of the instructions and data that one or more processing unit(s) 712 may need at runtime. In one or more implementations, the processes of the subject disclosure are stored in the system memory 704, the permanent storage device 702, and/or the ROM 710. From these various memory units, the one or more processing unit(s) 712 retrieves instructions to execute and data to process in order to execute the processes of one or more implementations.

The bus 708 also connects to the input and output device interfaces 714 and 706. The input device interface 714 enables a user to communicate information and select commands to the electronic system 700. Input devices that may be used with the input device interface 714 may include, for example, alphanumeric keyboards and pointing devices (also called "cursor control devices"). The output device interface 706 may enable, for example, the display of images generated by electronic system 700. Output devices that may be used with the output device interface 706 may include, for example, printers and display devices, such as a liquid crystal display (LCD), a light emitting diode (LED) display, an organic light emitting diode (OLED) display, a flexible display, a flat panel display, a solid state display, a projector, or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

Finally, as shown in FIG. 7, the bus 708 also couples the electronic system 700 to one or more networks and/or to one or more network nodes through the one or more network interface(s) 716. In this manner, the electronic system 700 can be a part of a network of computers (such as a LAN, a wide area network ("WAN"), or an Intranet, or a network of networks, such as the Internet. Any or all components of the electronic system 700 can be used in conjunction with the subject disclosure.

In accordance with various aspects of the subject disclosure, a method includes grouping text as a sequence of bytes, the text comprising a string of characters, each byte corresponding to a character in the text. For each byte of the sequence of bytes: (i) each is processed bit from most significant bit to least significant bit to generate a context; and a subsequent bit is predicted, using a prediction model, based on the context generated based on previously processed bits, prediction of the prediction model being a combination of predictions of a plurality of sub-models. An encoded bitstream is output based on the predicted bits, the encoded bitstream comprising encoded data corresponding to the text.

In accordance with various aspects of the subject disclosure, a non-transitory computer-readable medium is provided that includes instructions, which when executed by at least one computing device, cause the at least one computing device to perform operations including grouping text as a sequence of bytes, the text comprising a string of characters, each byte corresponding to a character in the text. For each byte of the sequence of bytes: (i) each is processed bit from most significant bit to least significant bit to generate a context; and a subsequent bit is predicted, using a prediction model, based on the context generated based on previously processed bits, prediction of the prediction model being a combination of predictions of a plurality of sub-models. An encoded bitstream is output based on the predicted bits, the encoded bitstream comprising encoded data corresponding to the text.

In accordance with various aspects of the subject disclosure, a device is provided that includes a memory and at least one processor communicatively coupled to the memory. The at least one processor is configured to group text as a sequence of bytes, the text comprising a string of characters, each byte corresponding to a character in the text. For each byte of the sequence of bytes: (i) each is processed bit from most significant bit to least significant bit to generate a context; and a subsequent bit is predicted, using a prediction model, based on the context generated based on previously processed bits, prediction of the prediction model being a combination of predictions of a plurality of sub-models. An encoded bitstream is output based on the predicted bits, the encoded bitstream comprising encoded data corresponding to the text.

The devices, methods and systems disclosed herein enable lossless compression of very small amount of data. Experiments conducted using known datasets indicate that compression of data using the methods, devices and systems described herein begin as early as the $4^{th}$ or $5^{th}$ byte of the text data being encoded. Those of skill in the art will appreciate that because the models and sub-models being used herein are static and require relatively small amounts of memory, a large number of instances of the encoding (or decoding) process can be run at the same time within a given architecture. Advantageously, the compression using the devices, methods and systems described herein can begin faster in comparison to dynamic models because loading of large dynamic model datasets is avoided.

Implementations within the scope of the present disclosure can be partially or entirely realized using a tangible computer-readable storage medium (or multiple tangible computer-readable storage media of one or more types) encoding one or more instructions. The tangible computer-readable storage medium also can be non-transitory in nature.

The computer-readable storage medium can be any storage medium that can be read, written, or otherwise accessed by a general purpose or special purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM, and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM, CBRAM, SONOS, RRAM, NRAM, racetrack memory, FJG, and Millipede memory.

Further, the computer-readable storage medium can include any non-semiconductor memory, such as optical disk storage, magnetic disk storage, magnetic tape, other magnetic storage devices, or any other medium capable of storing one or more instructions. In one or more implementations, the tangible computer-readable storage medium can be directly coupled to a computing device, while in other implementations, the tangible computer-readable storage medium can be indirectly coupled to a computing device, e.g., via one or more wired connections, one or more wireless connections, or any combination thereof.

Instructions can be directly executable or can be used to develop executable instructions. For example, instructions can be realized as executable or non-executable machine code or as instructions in a high-level language that can be compiled to produce executable or non-executable machine code. Further, instructions also can be realized as or can include data. Computer-executable instructions also can be organized in any format, including routines, subroutines, programs, data structures, objects, modules, applications, applets, functions, etc. As recognized by those of skill in the art, details including, but not limited to, the number, structure, sequence, and organization of instructions can vary significantly without varying the underlying logic, function, processing, and output.

While the above discussion primarily refers to microprocessor or multi-core processors that execute software, one or more implementations are performed by one or more integrated circuits, such as ASICs or FPGAs. In one or more implementations, such integrated circuits execute instructions that are stored on the circuit itself.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

As used in this specification and any claims of this application, the terms "base station", "receiver", "computer", "server", "processor", and "memory" all refer to electronic or other technological devices. These terms exclude people or groups of people. For the purposes of the specification, the terms "display" or "displaying" means displaying on an electronic device.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Phrases such as an aspect, the aspect, another aspect, some aspects, one or more aspects, an implementation, the implementation, another implementation, some implementations, one or more implementations, an embodiment, the embodiment, another embodiment, some implementations, one or more implementations, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration". Any embodiment described herein as "exemplary" or as an "example" is not necessarily to be construed as preferred or advantageous over other implementations. Furthermore, to the extent that the term "include", "have", or the like is used in the description or the claims, such term is intended to be inclusive in a manner similar to the phrase "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more". Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A method, comprising:
grouping text as a sequence of bytes, the text comprising a string of characters, each byte corresponding to a character in the text;
for each byte of the sequence of bytes:
processing each bit from most significant bit to least significant bit to generate a context; and
predicting a subsequent bit, using a prediction model, based on the context generated based on previously processed bits, prediction of the prediction model being a combination of predictions of a plurality of sub-models; and
outputting an encoded bitstream based on the predicted bits, the encoded bitstream comprising encoded data corresponding to the text.

2. The method of claim 1, wherein predicting the subsequent bit comprises generating a probability, using each of the plurality of sub-models, that the subsequent bit is 1 using a corresponding pre-determined number of previously processed bits as context, the probability being determined by a hash table lookup for the corresponding sub-model.

3. The method of claim 1, wherein at least one of the plurality of sub-models predicts a subsequent character based on a previously processed string of characters in the text.

4. The method of claim 1, wherein each of the plurality of sub-models is static model and is pre-trained using a known data set.

5. The method of claim 1, wherein the combination of predictions of the plurality of sub-models comprises combining different order predictions using a 3D function, each of the different order predictions obtained by combining a corresponding subset of sub-models among the plurality of sub-models.

6. The method of claim 5, wherein a low order prediction is based on a sub-model that uses one previously processed bit as a context for predicting the subsequent bit.

7. The method of claim 5, wherein combining the predictions of a first subset is performed using a medium order 3D function, and combining the predictions of a second subset is performed using a high order 3D function.

8. The method of claim 1, wherein the outputted encoded bitstream comprises a first encoded portion indicating a size of the data being encoded, a single bit indicating whether the data is compressed, and a third encoded portion encoding the data corresponding to the text.

9. A non-transitory computer-readable medium including instructions, which when executed by at least one computing device, cause the at least one computing device to perform operations including:
grouping text as a sequence of bytes, the text comprising a string of characters, each byte corresponding to a character in the text;

for each byte of the sequence of bytes:
   processing each bit from most significant bit to least significant bit to generate a context; and
   predicting a subsequent bit, using a prediction model, based on the context generated based on previously processed bits, prediction of the prediction model being a combination of predictions of a plurality of sub-models; and
   outputting an encoded bitstream based on the predicted bits, the encoded bitstream comprising encoded data corresponding to the text.

10. The non-transitory computer-readable medium of claim 9, wherein predicting the subsequent bit comprises generating a probability, using each of the plurality of sub-models, that the subsequent bit is 1 using a corresponding pre-determined number of previously processed bits as context, the probability being determined by a hash table lookup for the corresponding sub-model.

11. The non-transitory computer-readable medium of claim 9, wherein at least one of the plurality of sub-models predicts a subsequent character based on a previously processed string of characters in the text.

12. The non-transitory computer-readable medium of claim 9, wherein each of the plurality of sub-models is static model and is pre-trained using a known data set.

13. The non-transitory computer-readable medium of claim 9, wherein the combination of predictions of the plurality of sub-models comprises combining different order predictions using a 3D function, each of the different order predictions obtained by combining a corresponding subset of sub-models among the plurality of sub-models.

14. The non-transitory computer-readable medium of claim 13, wherein a low order prediction is based on a sub-model that uses one previously processed bit as a context for predicting the subsequent bit.

15. The non-transitory computer-readable medium of claim 13, wherein combining the predictions of a first subset is performed using a medium order 3D function, and combining the predictions of a second subset is performed using a high order 3D function.

16. The non-transitory computer-readable medium of claim 9, wherein the outputted encoded bitstream comprises a first encoded portion indicating a size of the data being encoded, a single bit indicating whether the data is compressed, and a third encoded portion encoding the data corresponding to the text.

17. A device including an input, an output, a memory and at least one processor communicatively coupled to the memory, the at least one processor configured to:
   group text as a sequence of bytes, the text comprising a string of characters, each byte corresponding to a character in the text;
   for each byte of the sequence of bytes:
      process each bit from most significant bit to least significant bit to generate a context; and
      predict a subsequent bit, using a prediction model, based on the context generated based on previously processed bits, prediction of the prediction model being a combination of predictions of a plurality of sub-models; and
   output an encoded bitstream based on the predicted bits, the encoded bitstream comprising encoded data corresponding to the text.

18. The device of claim 17, wherein predicting the subsequent bit comprises generating a probability, using each of the plurality of sub-models, that the subsequent bit is 1 using a corresponding pre-determined number of previously processed bits as context, the probability being determined by a hash table lookup for the corresponding sub-model.

19. The device of claim 17, wherein the combination of predictions of the plurality of sub-models comprises combining different order predictions using a 3D function, each of the different order predictions obtained by combining a corresponding subset of sub-models among the plurality of sub-models.

20. The device of claim 17, wherein the outputted encoded bitstream comprises a first encoded portion indicating a size of the data being encoded, a single bit indicating whether the data is compressed, and a third encoded portion encoding the data corresponding to the text.

* * * * *